(12) United States Patent
Shih et al.

(10) Patent No.: US 11,189,523 B2
(45) Date of Patent: Nov. 30, 2021

(54) SEMICONDUCTOR STRUCTURE AND FABRICATION METHOD THEREOF

(71) Applicant: NANYA TECHNOLOGY CORPORATION, New Taipei (TW)

(72) Inventors: Shing-Yih Shih, New Taipei (TW); Mao-Ying Wang, New Taipei (TW); Hung-Mo Wu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/439,690

(22) Filed: Jun. 12, 2019

(65) Prior Publication Data

US 2020/0395242 A1    Dec. 17, 2020

(51) Int. Cl.
*H01L 21/768* (2006.01)
*H01L 23/31* (2006.01)
*H01L 23/522* (2006.01)

(52) U.S. Cl.
CPC .. *H01L 21/76804* (2013.01); *H01L 21/76805* (2013.01); *H01L 21/76883* (2013.01); *H01L 23/3192* (2013.01); *H01L 23/5226* (2013.01)

(58) Field of Classification Search
CPC ......... H01L 21/76804; H01L 21/76805; H01L 21/76807; H01L 21/76816; H01L 23/3192; H01L 23/5226
See application file for complete search history.

(56) References Cited

U.S. PATENT DOCUMENTS

| | | | | |
|---|---|---|---|---|
| 4,832,788 A | * | 5/1989 | Nemiroff | H01L 21/31138 257/E21.256 |
| 9,431,345 B2 | * | 8/2016 | Sakata | H01L 23/53238 |
| 10,312,093 B2 | * | 6/2019 | Zhang | H01L 21/76804 |
| 2006/0014381 A1 | * | 1/2006 | Lee | H01L 21/76813 438/638 |
| 2006/0094231 A1 | * | 5/2006 | Lane | H01L 23/481 438/637 |
| 2013/0069224 A1 | | 3/2013 | Kim et al. | |
| 2020/0091055 A1 | * | 3/2020 | Yang | H01L 23/53266 |

* cited by examiner

*Primary Examiner* — Jose R Diaz
(74) *Attorney, Agent, or Firm* — CKC & Partners Co., LLC

(57) ABSTRACT

A method of forming a semiconductor structure includes the following steps. A dielectric layer is formed over a conductive line. A photoresist layer is formed over the dielectric layer. The photoresist layer is patterned to form a mask feature and an opening is defined by the mask feature. The opening has a bottom portion and a top portion communicated to the bottom portion, and the top portion is wider than the bottom portion. The dielectric layer is etched to form a via hole in the dielectric layer using the mask feature as an etch mask, such that the via hole has a bottom portion and a tapered portion over the bottom portion. The conductive material is filled in the via hole to form a conductive via.

3 Claims, 14 Drawing Sheets

SEMICONDUCTOR STRUCTURE AND FABRICATION METHOD THEREOF

BACKGROUND

Technical Field

The present disclosure relates to a semiconductor structure and a method of forming the semiconductor structure. More particularly, the present disclosure relates to forming a redistribution layer (RDL) of a semiconductor structure.

Description of Related Art

With the rapid growth of electronic industry, the development of integrated circuits (ICs) has achieved high performance and miniaturization. Technological advances in IC materials and design have produced generations of ICs where each generation has smaller and more complex circuits than the previous generation. As a result, via holes for a redistribution layer (RDL) of an IC are scaled down as well.

SUMMARY

According to some embodiments of the present disclosure, a method of forming a semiconductor structure includes the following steps. A dielectric layer is formed over a conductive line. A photoresist layer is formed over the dielectric layer. The photoresist layer is patterned to form a mask feature and an opening is defined by the mask feature. The opening has a bottom portion and a top portion communicated to the bottom portion, and the top portion is wider than the bottom portion. The dielectric layer is etched to form a via hole in the dielectric layer using the mask feature as an etch mask, such that the via hole has a bottom portion and a tapered portion over the bottom portion. The conductive material is filled in the via hole to form a conductive via.

According to some embodiments of the present disclosure, the method further includes deepening the via hole such that a recess is formed within the conductive line.

According to some embodiments of the present disclosure, the method further includes filling the conductive material into the recess.

According to some embodiments of the present disclosure, the photoresist layer is patterned by using a photomask having a light semi-transmissive portion between a light transmissive portion and a light shielding portion.

According to some embodiments of the present disclosure, the mask feature has an outer portion and an inner portion wider than the outer portion. The inner portion is in contact with the dielectric layer.

According to some embodiments of the present disclosure, a semiconductor structure includes a semiconductor device, a conductive line, a dielectric layer and a redistribution layer (RDL). The conductive line is present over the semiconductor device. The dielectric layer is present over the conductive line. The RDL includes a conductive structure over the dielectric layer and a conductive via extending downwards from the conductive structure and through the dielectric layer. The conductive via comprises a bottom portion, a top portion, and a tapered portion between the bottom and top portions, wherein the tapered portion has a width variation greater than that of the bottom and top portions.

According to some embodiments of the present disclosure, the tapered portion tapers from the top portion to the bottom portion.

According to some embodiments of the present disclosure, the bottom portion is in contact with the conductive line.

According to some embodiments of the present disclosure, the semiconductor structure further includes a protective layer. The protective layer is present over the RDL.

According to some embodiments of the present disclosure, the bottom surface of the conductive via is below the top surface of the conductive line.

In summary, the disclosure provides a semiconductor structure and fabrication method. The via hole includes the bottom portion, the tapered portion, and the top portion. Since the tapered portion and the top portion are wider than the bottom portion, the tapered portion and the top portion can provide more space for metal deposition, which in turn can mitigate any adverse impact resulting from the overhang of following metal deposition. Moreover, the bottom portion is more narrow than the tapered portion and the top portion, in such a way, an improved via density can be achieved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
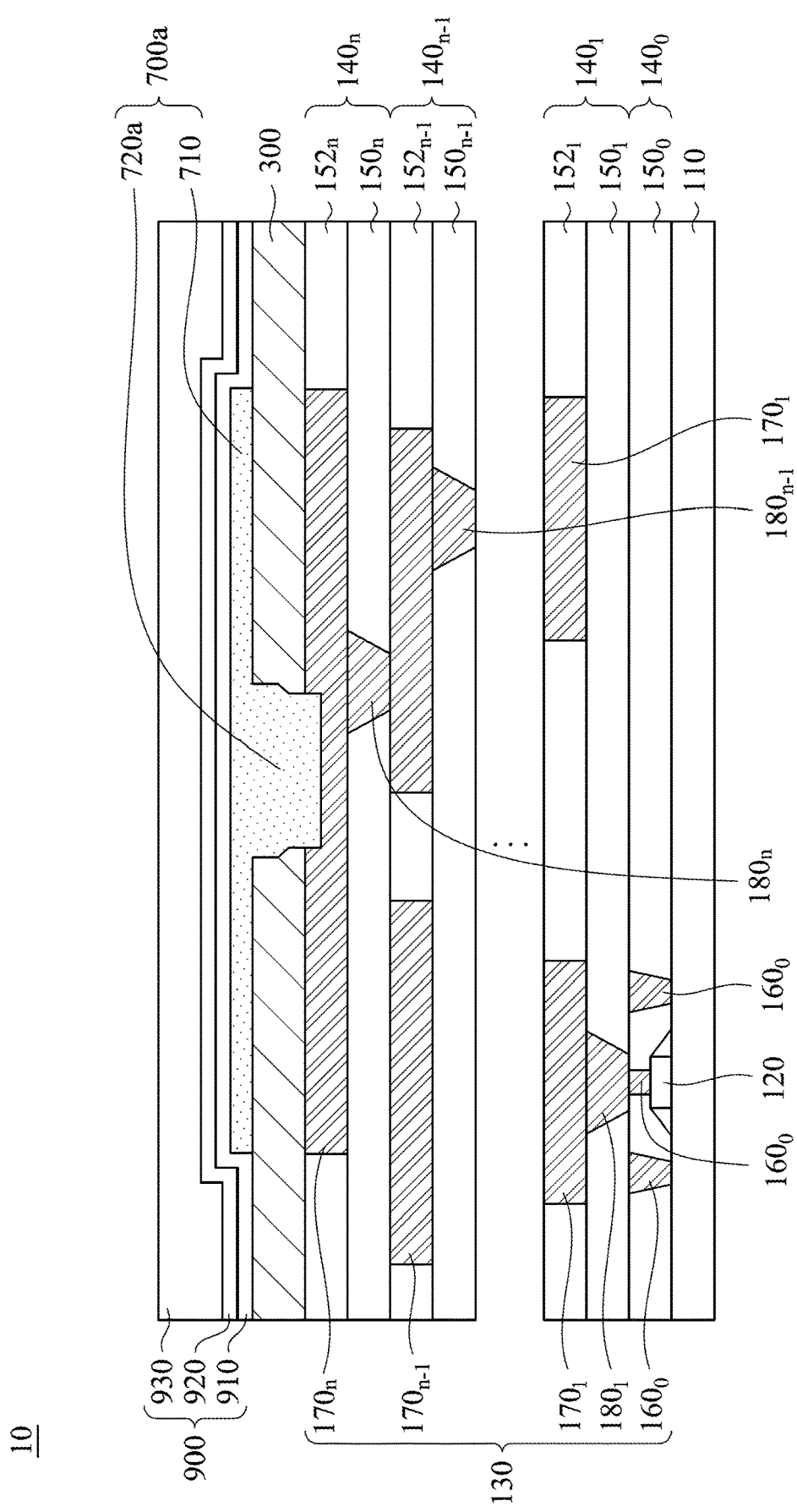
FIG. 1 is a schematic cross-section view showing a semiconductor structure in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a schematic cross-section view showing a semiconductor structure 10 in accordance with some embodiments of the present disclosure. Referring to FIG. 1, a dielectric layer 300 is present over an interconnect structure 130 that is present over a substrate 110. A redistribution layer 700a including a conductive via 710 and a conductive structure 720a is present over the substrate 110. The RDL 700a is in contact with the dielectric layer 300. A protective layer 900 is present over and covers the RDL 700a.

In some embodiments, the substrate 110 may be a silicon substrate. Alternatively, the substrate 110 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 110 is a semiconductor-on-insulator (SOI) such as having a buried layer.

In some embodiments, one or more active and/or passive devices 120 are formed over the substrate 110. The one or more active and/or passive devices 120 may include various N-type metal-oxide semiconductor (NMOS) and/or P-type metal-oxide semiconductor (PMOS) devices, such as transistors, capacitors, resistors, diodes, photo-diodes, fuses, and the like.

The interconnect structure 130 is formed over the one or more active and/or passive devices 120 and the substrate 110. The interconnect structure 130 electrically interconnects the one or more active and/or passive devices 120 to form functional electrical circuits within the semiconductor structure 10. The interconnect structure 130 may include one or more metallization layers $140_0$ to $140_n$, wherein n+1 is the number of the one or more metallization layers $140_0$ to $140_n$. In some embodiments, the value of n may vary in response to design specifications of the semiconductor structure 10. The metallization layers $140_1$ to $140_n$ may include dielectric layers $152_1$ to $152_n$, conductive plugs $160_0$, conductive lines $170_1$ to $170_n$, and conductive vias $180_1$ to $180_n$. The dielectric layers $152_1$ to $152_n$ are formed over the corresponding dielectric layers $150_1$ to $150_n$.

In some embodiments, the metallization layer $140_0$ may include conductive plugs $160_0$ through the dielectric layer $150_0$, and the metallization layers $140_1$ to $140_n$ comprise one or more conductive interconnects, such as conductive lines $170_1$ to $170_n$ respectively in dielectric layers $152_1$ to $152_n$ and conductive vias $180_1$ to $180_n$ respectively in dielectric layers $150_1$ to $150_n$. The conductive plugs $160_0$ electrically couple the one or more active and/or passive devices 120 to the conductive lines $170_1$ to $170_n$ and the conductive vias $180_1$ to $180_n$. In some embodiments where a passive device 120 is a transistor, the conductive plugs $160_0$ can be respectively land on a gate electrode, and source/drain regions of the passive device (transistor) 120 and thus respectively serve as a gate contact, and source/drain contacts.

In some embodiments, the conductive plugs $160_0$, the conductive lines $170_1$ to $170_n$ and the conductive vias $180_1$ to $180_n$ may be formed using any suitable method, such as damascene, dual damascene, or the like. The conductive plugs $160_0$, the conductive lines $170_1$ to $170_n$ and the conductive vias $180_1$ to $180_n$ may comprise conductive materials such as copper, aluminum, tungsten, combinations thereof, or the like. In some embodiments, the conductive plugs $160_0$, the conductive lines $170_1$ to $170_n$, and the conductive vias $180_1$ to $180_n$ may further comprise one or more barrier/adhesion layers (not shown) to protect the respective dielectric layers $150_0$ to $150_n$ and $152_0$ to $152_n$ from metal diffusion and metallic poisoning. The one or more barrier/adhesion layers may comprise titanium, titanium nitride, tantalum, tantalum nitride, or the like, and may be formed using physical vapor deposition (PVD), CVD, ALD, or the like.

FIGS. 2, 3 and 5-14 are schematic cross-sectional views of a method of forming a semiconductor structure 10 at various stages in accordance with some embodiments of the present disclosure. In order to clearly illustrate the features in the present embodiment, the substrate 110 and the interconnect structure 130 (as shown FIG. 1) are not shown in FIGS. 2, 3 and 5-14.

Figure 2:
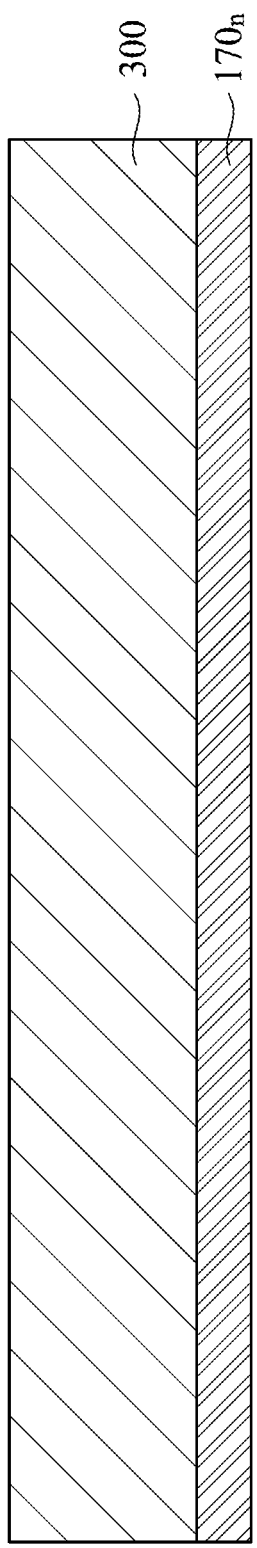
FIGS. 2-3 and 5-14 are schematic cross-sectional views of a method of forming a semiconductor structure at various stages in accordance with some embodiments of the present disclosure.

Referring to FIG. 2, a dielectric layer 300 is formed over the conductive line $170_n$. The method of forming the dielectric layer 300 may use, for example, PVD, CVD, ALD, or other suitable technique. In some embodiments, the dielectric layer 300 may include a single or multiple layers. The dielectric layer 300 may include silicon oxide, silicon nitride, silicon oxynitride, or other suitable materials. In some embodiments, a barrier layer (not shown) is formed over the conductive line $170_n$ before the dielectric layer 300 is formed. The barrier layer may be beneficial to the adhesion between the conductive line $170_n$ and the dielectric layer 300.

Figure 3:
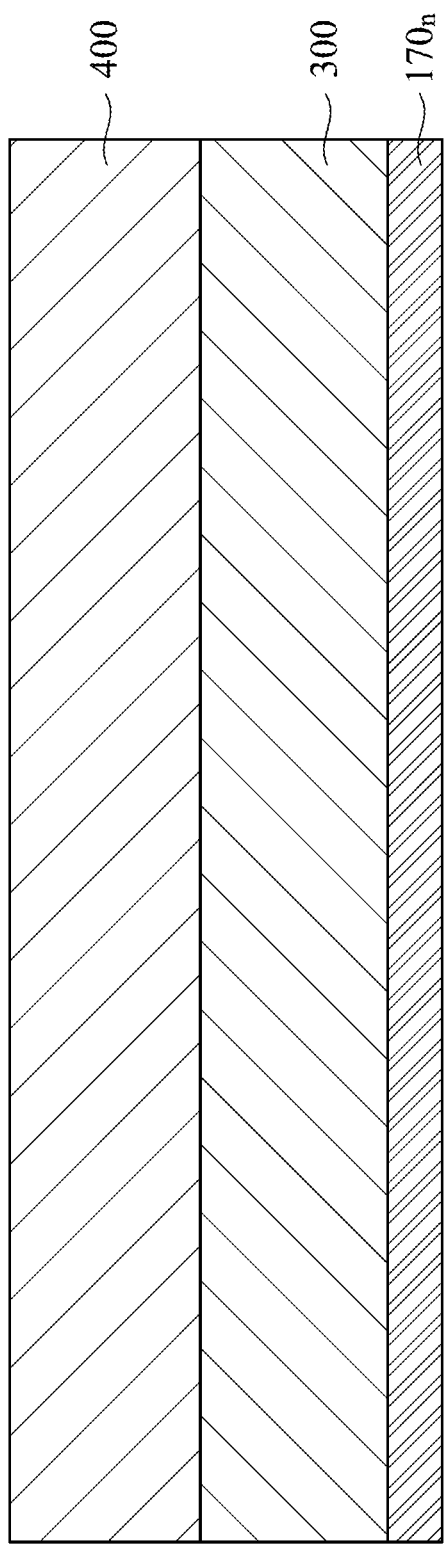

Referring to FIG. 3, a photoresist layer 400 is formed over the dielectric layer 300. In some embodiments, the method of forming the photoresist layer 400 may include forming a plasma enhanced tetraethoxysilane (PETEOS) film over the dielectric layer 300. In some embodiments, the photoresist layer 400 may include an organic material, such as a spin-on carbon (SOC) material, or the like.

Figure 4:
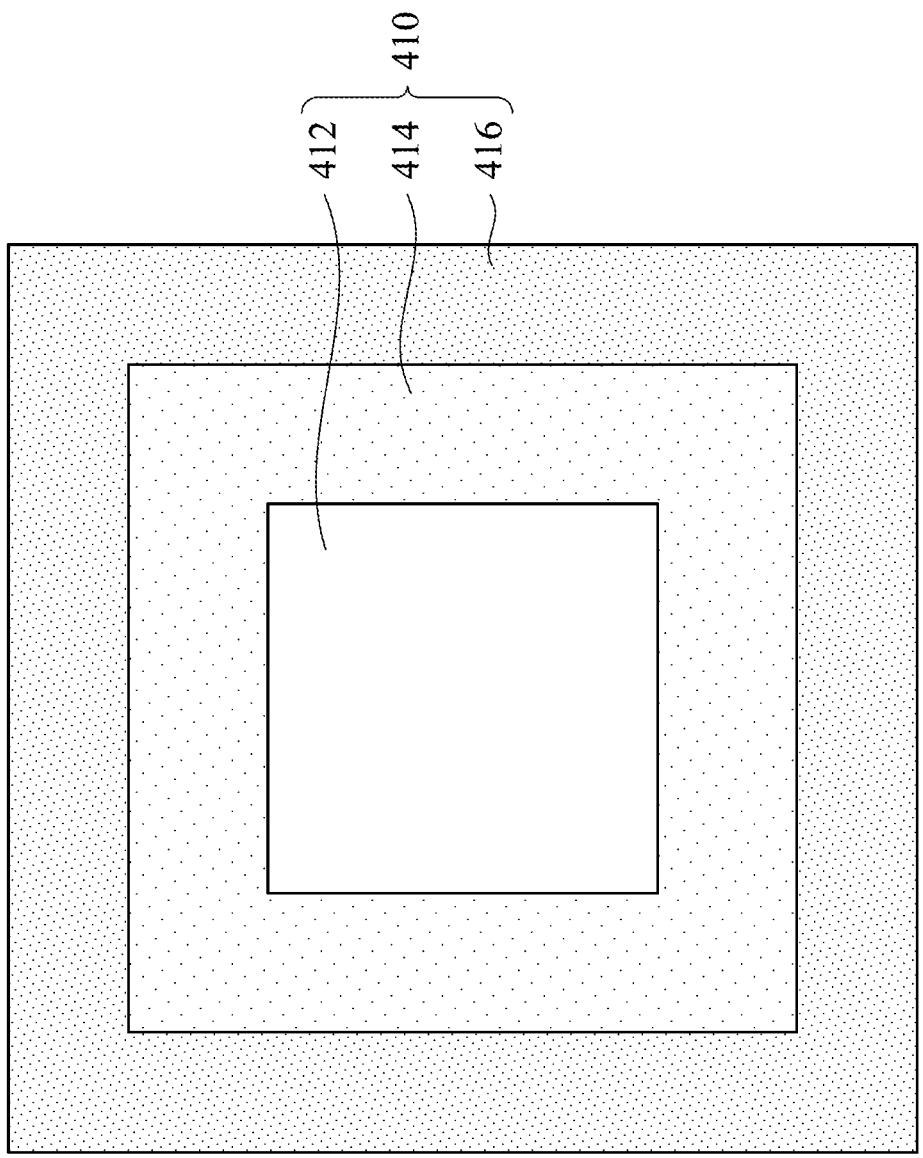
FIG. 4 is a schematic view of an embodiment of a photomask layer which is used to pattern a photoresist layer.
Figure 5:
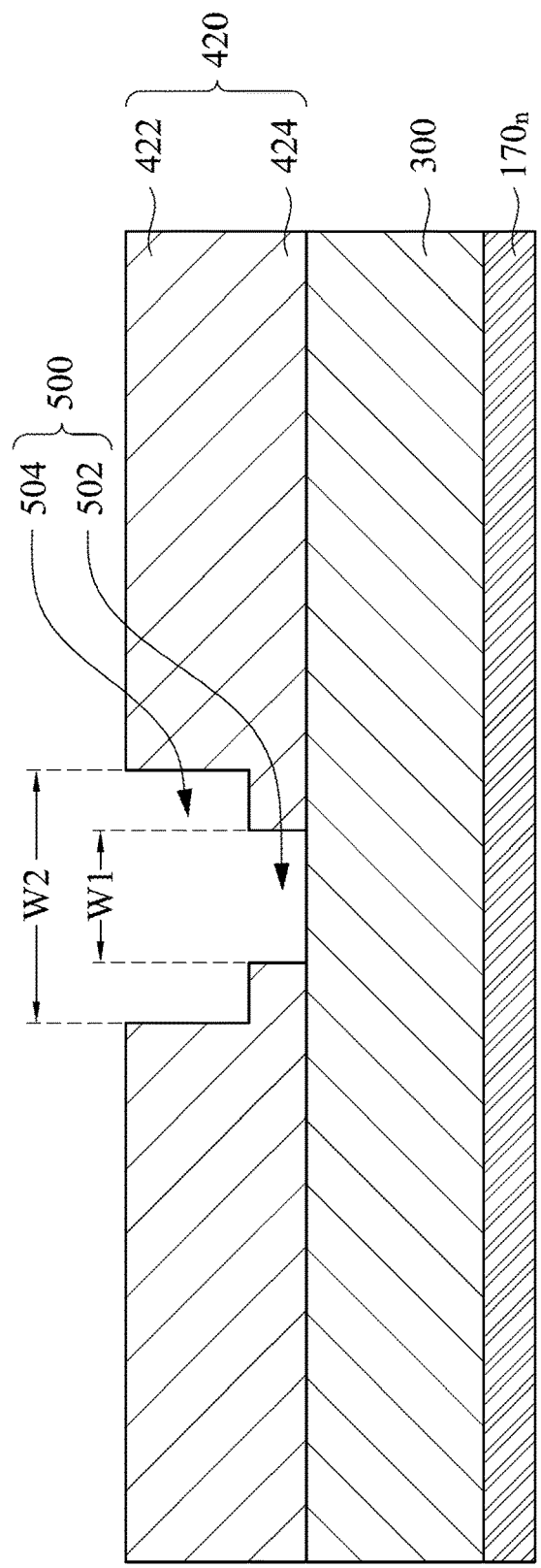

Referring to FIG. 4 and FIG. 5, FIG. 4 is a schematic view of a photomask 410 which is used to pattern a photoresist layer 400 in FIG. 4. As shown in FIG. 4, the photomask 410 includes a light transmissive portion 412, a light semi-transmissive portion 414, and a light shielding portion 416. The density of light shielding area of the light shielding portion 416 is larger than that of the light semi-transmissive portion 414. The light semi-transmissive portion 414 is present between the light transmissive portion 412 and the light shielding portion 416. In some embodiments, the method of forming the photomask 410 with the light transmissive portion 412, a light semi-transmissive portion 414, and a light shielding portion 416 may use chrome on glass (COG), phase shift mask, or other suitable methods.

As shown in FIG. 5, the photomask 420 (as shown FIG. 4) is used to pattern the photoresist layer 400 (as shown FIG. 2) and thus a mask feature 420 is formed. In other words, the photoresist layer 400 (as shown FIG. 2) is patterned by using suitable photolithography techniques to form a mask feature 420. The mask feature 420 has an outer portion 422 and an inner portion 424. The inner portion 424 is wider than the outer portion 422. The inner portion 424 is in contact with the dielectric layer.

In the present embodiment, an opening 500 is defined by the mask feature 420, and the opening 500 exposes the dielectric layer 300. The opening has a bottom portion 502 and a top portion 504, and the top portion 504 is communicated to the bottom portion 502. In greater detail, the bottom portion 502 has a width W1, while the top portion 504 has a width W2. The width W2 is wider than the width W1. Since the light transmissive portion 412, semi-transmissive portion 414, and the shielding portion 416 of the photomask 410 have different light transmission depths, the mask feature 420 in FIG. 5 is caused to have the opening 500, and the opening 500 has the bottom portion 502 with the width W1 and the top portion 504 with the width W2.

Figure 6:
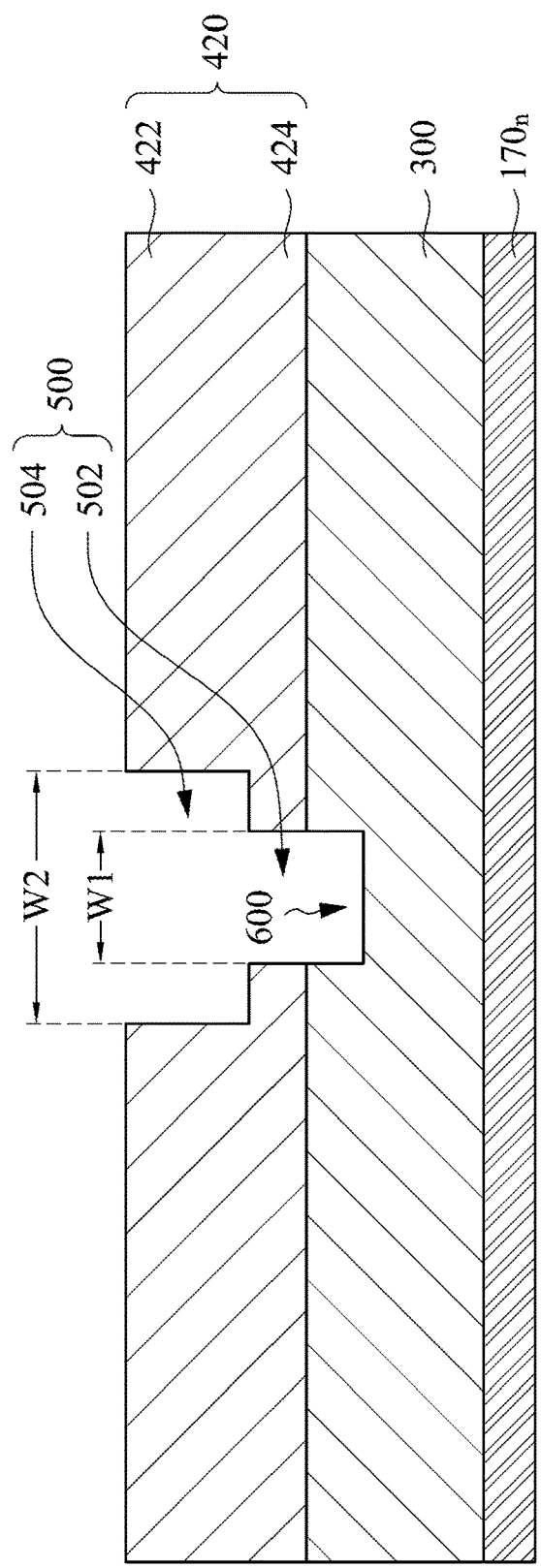

Referring to FIG. 6, the dielectric layer 300 is etched using the mask feature 420 as an etch mask. This etching process results in a via hole 600 in the dielectric layer 300, and the via hole 600 has substantially width W1 as the width W1 of the bottom portion 502 of the opening 500 in the mask feature, because the etching process is performed using the mask feature 420 as an etch mask.

As shown in FIG. 6, a portion of the dielectric layer 300 remains below the via hole 600. The via hole 600 is present below the opening 500. In other words, the portion of the dielectric layer 300 remains between the via hole 600 and the underlying conductive line $170_n$.

In some embodiments, the method of etching the dielectric layer 300 may use dry etching. The dry etchant, e.g., $H_2$ and $N_2$, may be selected for dry etching process to etch the dielectric layer 300.

Figure 7:
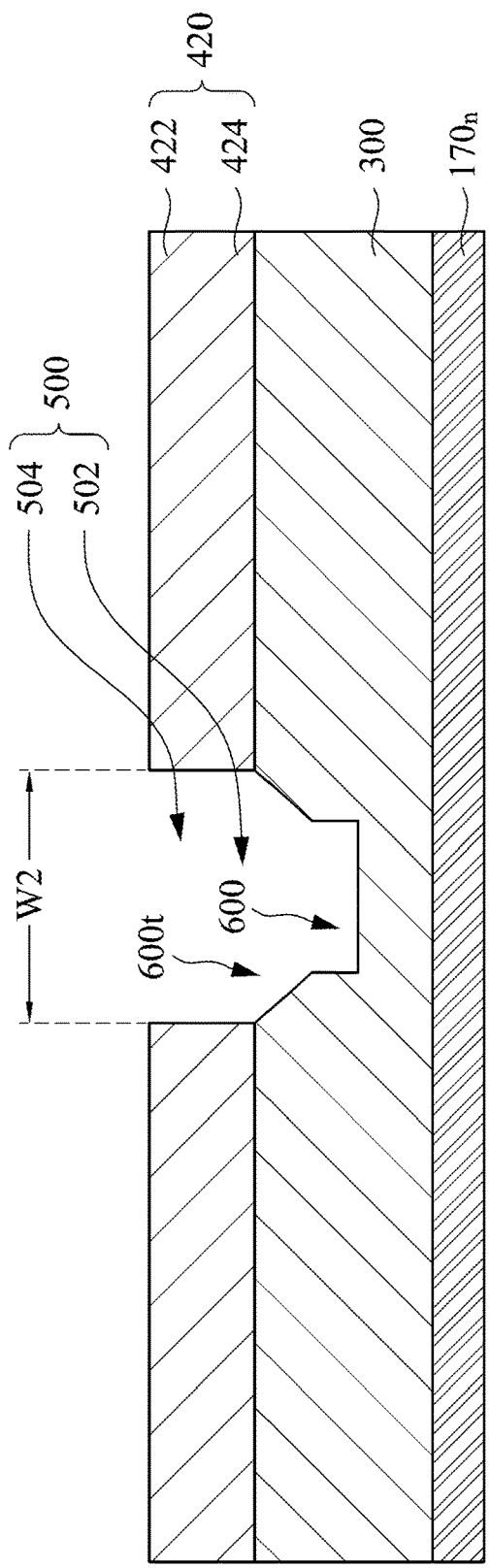

Referring to FIG. 7, the dielectric layer 300 is etched using the mask feature 420 as an etch mask such that the via hole 600 is deepened and expanded. In greater details, the inner portion 424 of the mask feature 420 is consumed during the etching process, and thickness of the outer portion 422 of the mask feature 420 is reduced, such that the outer portion 422 of the mask feature 420 is aligned with the inner portion 424 of the mask feature 420. In other words, a portion of the dielectric layer 300 below the inner portion 424 is etched after the inner portion 424 of the mask feature 420 is consumed, thereby causing the via hole 600 having a tapered profile. Stated differently, since the mask feature 420 (as shown FIG. 6) has a stepped profile, e.g., the inner portion 424 and the outer portion 422, the via hole 600 has a tapered profile. In some embodiments, the width of the top portion 504 of the opening 500 is equal to the bottom portion 502 of the opening 500. Since the mask feature 420 has an laterally expanded bottom portion 502 of the opening 500, the etching process results in laterally expanding the top portion 600t of the via hole 600 in an interface of the dielectric layer 300 and the mask feature 420. In greater detail, the top portion 600t of the via hole 600 is expanded and has a width W2. For example, the width W2 of the top portion 600t of the via hole 600 is equal to the width W2 of the top portion 504 of the opening 500 in FIG. 5.

In some embodiments, etching the dielectric layer 300 to expand the via hole 600 in FIG. 7 is in-situ performed with the previous etching process in FIG. 6. Stated differently, the etching process of expanding the via hole 600 and the etching process in FIG. 6 can be performed without vacuum break. For example, the etching process of expanding the via hole 600 and the etching process in FIG. 6 can be performed in the same etching tool and have substantially the same etching parameters.

Figure 8:
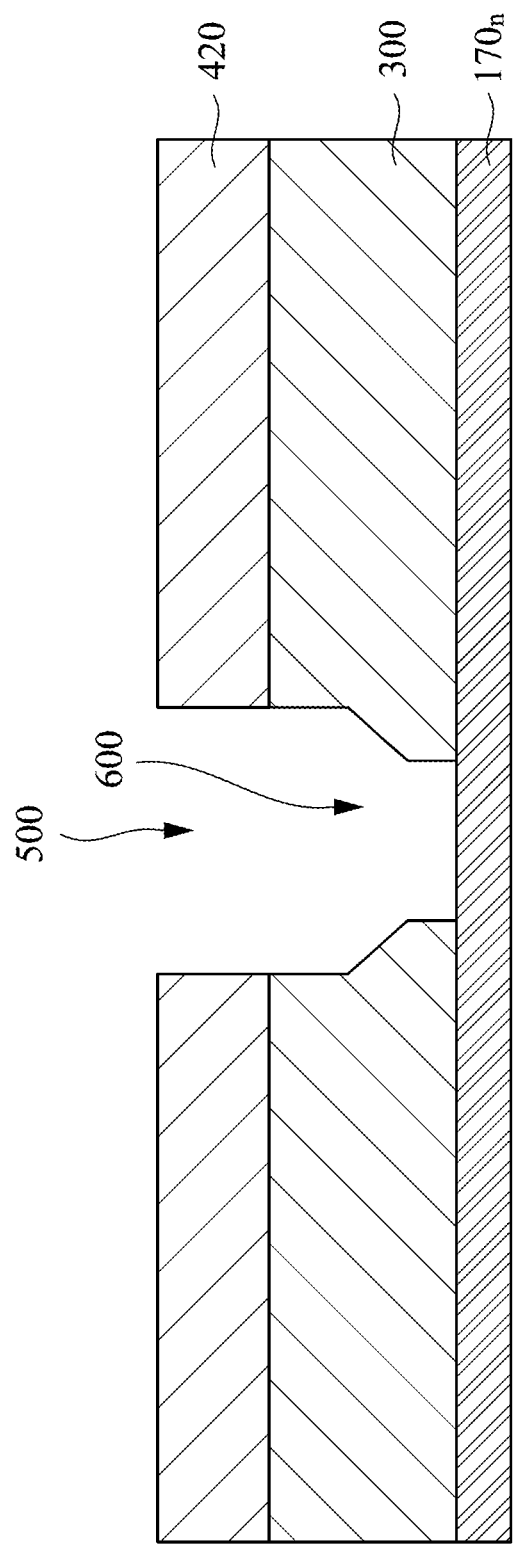

Referring to FIG. 8, the dielectric layer 300 is etched using the mask feature 420 as the etch mask. In greater detail, the etching process deepens the via hole 600 until reaching the conductive line $170_n$. In other words, the conductive line $170_n$ is exposed. In some embodiments, etching the dielectric layer 300 to deepen the via hole 600 in FIG. 8 is in-situ performed with the previous etching process in FIG. 7. Stated differently, the etching process of deepening the via hole 600 and the etching process of expanding the via hole 600 (as shown in FIG. 7) can be performed without vacuum break. For example, the etching process of deepening the via hole 600 and the etching process of expanding the via hole 600 can be performed in the same etching tool and have substantially the same etching parameters.

Figure 9:
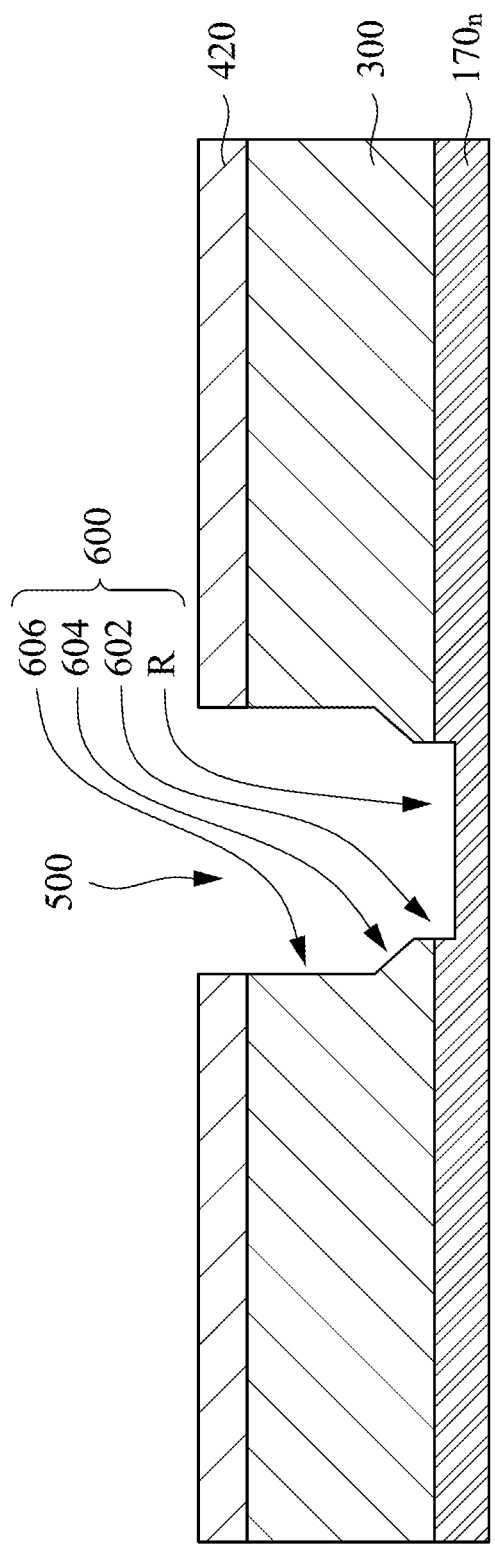

Referring to FIG. 9, the dielectric layer 300 is etched using the mask feature 420 as the etch mask. The etching process deepens the via hole 600 such that a recess R is formed within the conductive line $170_n$. In greater detail, the via hole 600 has a bottom portion 602, a tapered portion 604 over the bottom portion 602, and a top portion 606 over the tapered portion 604. The tapered portion 604 tapers from the top portion 606 to the bottom portion 602. A width variation of the bottom portion 602 is less than that of the tapered portion 604, and a width variation of the top portion 606 is less than that of the tapered portion 604 as well. The bottom portion 602 of the via hole 600 is in contact with the conductive line $170_n$. In other words, the bottom portion 602 of the via hole 600 is in contact with the dielectric layer 300 and the conductive line $170_n$.

In some embodiments, the width of the bottom portion 602 is substantially unchanged, and the width of the top portion 606 is substantially unchanged as well. Since the tapered portion 604 and the top portion 606 is wider than the bottom portion 602, the tapered portion 604 and the top portion 606 can provide more space for following metal deposition, which in turn can mitigate the adverse impact resulting from overhang of following metal deposition. Moreover, because the bottom portion 602 is narrower than the tapered portion 604 and the top portion 606, an improved via density can be achieved.

In some embodiments, deepening the via hole 600 within the conductive line $170_n$ is in-situ performed with the previous etching process of deepening the via hole 600 in the dielectric layer 300 (as shown in FIG. 8). In other words, the etching process of deepening the via hole 600 within the conductive line $170_n$ and the etching process of deepening the via hole 600 in the dielectric layer 300 can be performed without vacuum break. For example, the etching process of deepening the via hole 600 within the conductive line $170_n$ and the etching process of deepening the via hole 600 in the dielectric layer 300 can be performed in the same etching tool and have substantially the same etching parameters.

Figure 10:
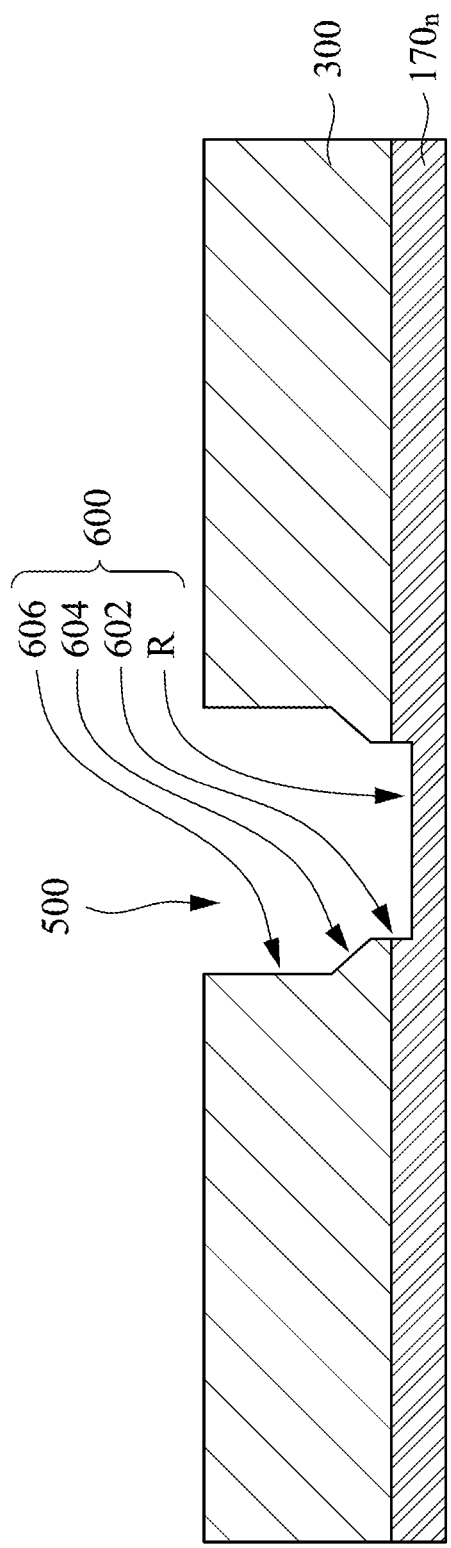

Referring to FIG. 10, the mask feature 420 is removed. In some embodiments, removing the mask feature 420 may be performed by using a photoresist strip process, such as an ashing process.

Figure 11:
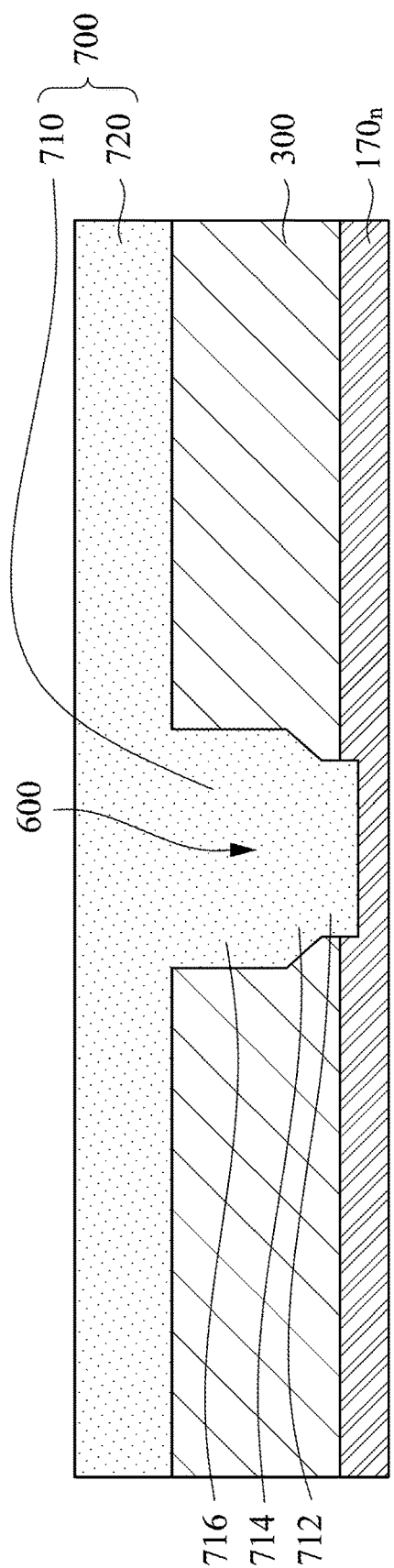

Referring to FIG. 11, a conductive material is filled in the via hole 600. In other words, the conductive material is also filled into the recess R (as shown FIG. 10). As shown in FIG. 11, a conductive layer 700 is formed over the dielectric layer 300. In the greater detail, the conductive layer 700 includes a conductive via 710 and a conductive structure 720. The conductive layer 700 covers the dielectric layer 300 and is filled into the via hole 600 to form the conductive via 710 in the via hole 600. In some embodiments, the conductive layer 700 includes a metal or a metal alloy such as aluminum (Al), copper (Cu), other suitable conductive material, or combinations thereof. The conductive layer 700 may be formed by a PVD method such as sputtering method, or other suitable methods.

In the present embodiment, the conductive via 710 extends downwards from the conductive structure 720 and through the dielectric layer 300. Because the conductive via 710 fills the via hole 600, the conductive via 710 inherits the profile of the via hole 600. In greater detail, the conductive via 710 includes a bottom portion 712, a tapered portion 714, and a top portion 716. The tapered portion 714 tapers from the top portion 716 to the bottom portion 712. A width variation of the bottom portion 712 is less than that of the tapered portion 714, and a width variation of the top portion 716 is less than that of the tapered portion 714 as well. For example, the width of the bottom portion 712 is substantially unchanged, and the width of the top portion 716 is substantially unchanged as well. In the present embodiment, the bottom surface of the conductive via 710 is below the top surface of the conductive line $170_n$.

Figure 12:
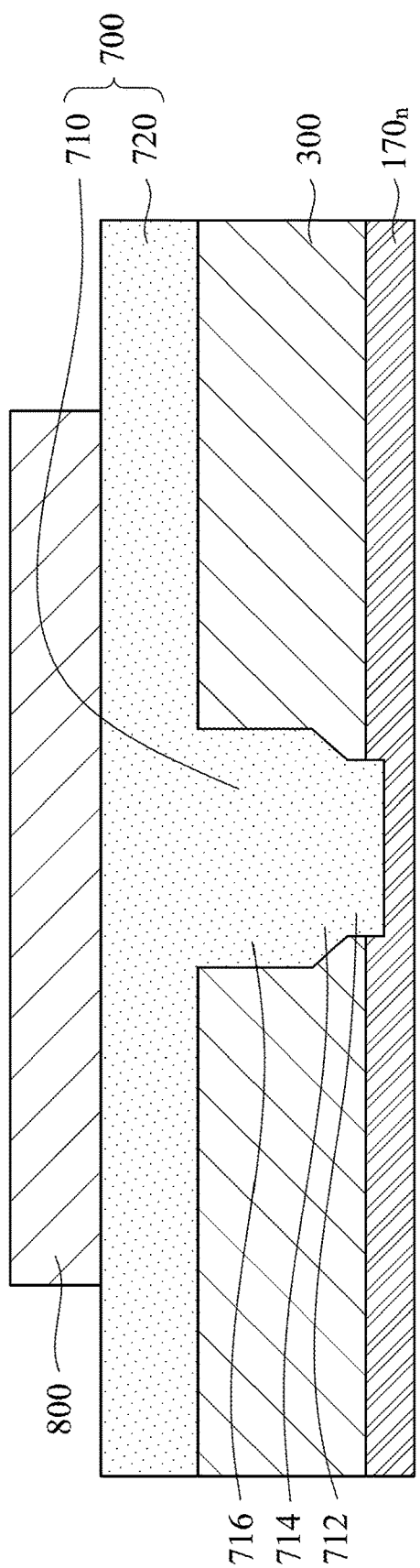

Referring to FIG. 12, a patterned mask feature 800 is formed over the conductive layer 700. The patterned mask feature 800 covers a portion of the conductive structure 720, while exposes the other portion of the conductive structure 720. In the present embodiment, the patterned mask feature 800 is a photoresist layer. The method of forming the patterned mask feature 800 may include first forming a photoresist layer and then patterning the photoresist layer with a photolithography process.

Figure 13:
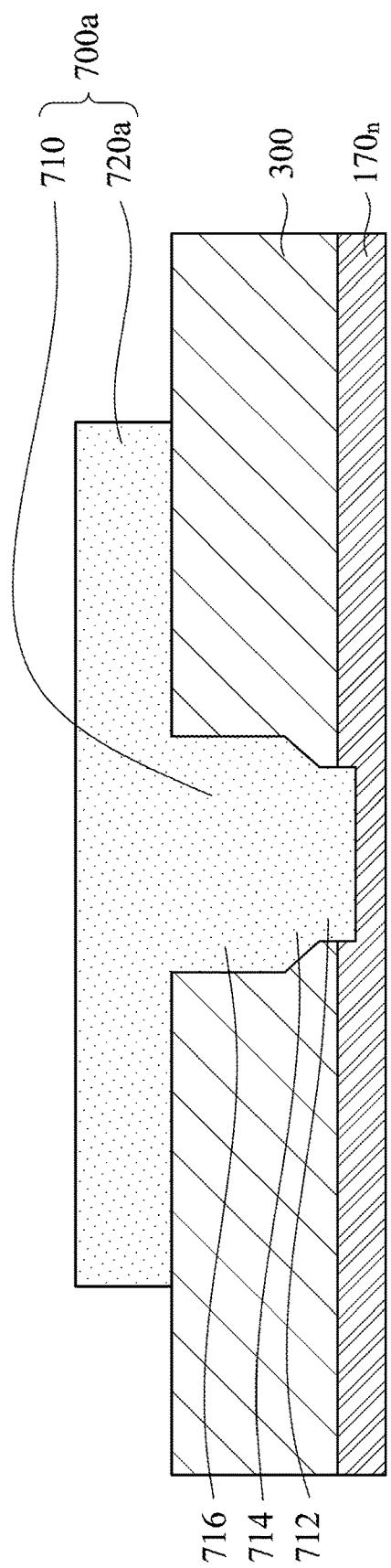

Afterwards, the conductive layer 700 is patterned using the patterned mask feature 800 as an etch mask. The resulting structure is shown in FIG. 13. After patterning the conductive layer 700 using suitable etching techniques, the patterned mask feature 800 is removed by, for example, an ashing process. As shown in FIG. 13, the redistribution layer (RDL) 700a includes a conductive structure 720a and the conductive via 710. The conductive structure 720a covers the conductive via 710 and a portion of the dielectric layer 300, while exposes the other portion of the dielectric layer 300.

Figure 14:
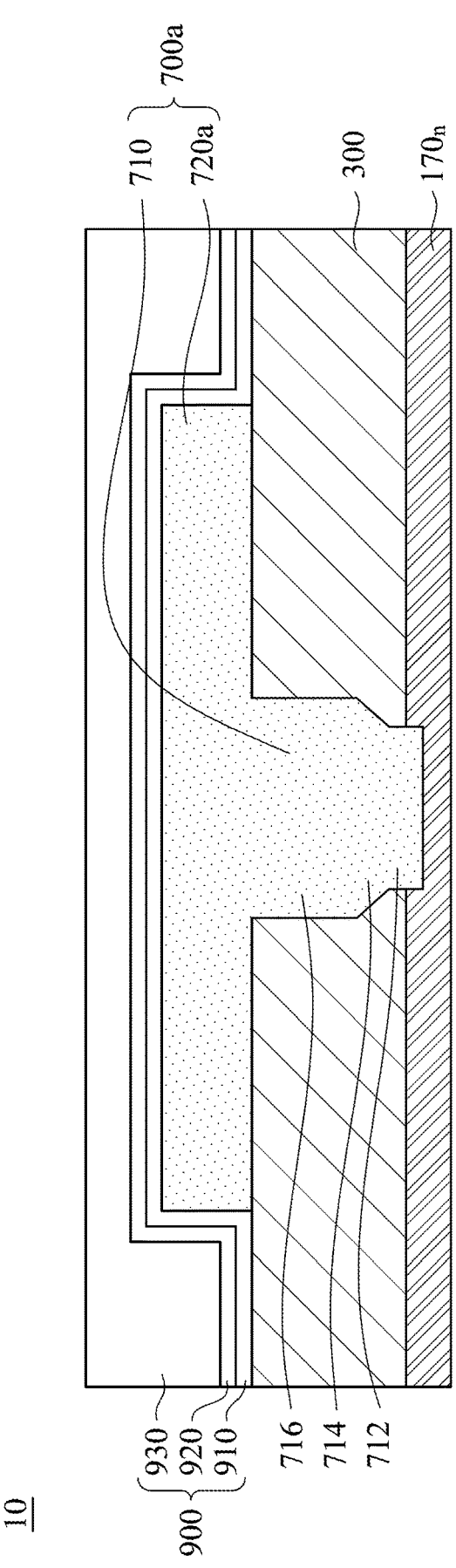

Referring to FIG. 14, a protective layer 900 is formed on the substrate 110 to cover the RDL 700a and the dielectric layer 300. In some embodiments, the protective layer 900 is a single, double, or multi-layer structure. The protective layer 900 may include silicon oxide, silicon, silicon oxynitride, silicon nitride, an organic material, a polymer or combinations thereof. The organic material is, for example, benzocyclobutene (BCB), and the polymer is, for example, polyimide (PI). The protective layer 900 may be formed by a CVD method, a coating method, or other suitable method. In the present embodiment, the protective layer 900 includes a silicon oxide layer 910, a silicon nitride layer 920, and a polyimide layer 930.

In summary, the conductive via includes the bottom portion, the tapered portion, and the top portion. Since the tapered portion and the top portion are wider than the bottom portion, the tapered portion and the top portion are beneficial to mitigating the adverse impact, such as overhang of metal deposition. Moreover, since the bottom portion is more narrow than the tapered portion and the top portion, an improved via density can be achieved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method, comprising:
   forming a dielectric layer over a conductive line;
   forming a photoresist layer over the dielectric layer;
   patterning the photoresist layer to form a mask feature and an opening defined by the mask feature, wherein the opening has a bottom portion and a top portion communicated to the bottom portion, the top portion of the opening is wider than the bottom portion of the opening, and the top portion of the opening and the bottom portion of the opening together form a step at a sidewall of the opening of the mask feature;
   etching the dielectric layer to form a via hole in the dielectric layer using the mask feature as an etch mask, such that the via hole has a bottom portion, a top portion over the bottom portion, and a tapered portion between the bottom portion and the top portion, wherein the tapered portion of the via hole has a width variation greater than that of the bottom and top portions of the via hole, the tapered portion of the via hole has an inclined sidewall, and the top portion of the via hole has a sidewall extending upwards from the inclined sidewall of the tapered portion of the via hole;
   deepening the via hole such that a recess is formed within the conductive line; and
   filling a conductive material in the via hole and the recess to form a conductive via, such that the conductive via comprises a bottom portion, a top portion, and a tapered portion between the bottom and top portions, wherein the dielectric layer laterally surrounds the top portion of the conductive via, the tapered portion of the conductive via, and a top of the bottom portion of the conductive via, and the conductive line laterally surrounds a bottom of the bottom portion of the conductive via.

2. The method of claim 1, wherein the photoresist layer is patterned by using a photomask having a light semi-transmissive portion between a light transmissive portion and a light shielding portion.

3. The method of claim 1, wherein the mask feature has an outer portion and an inner portion wider than the outer portion, and the inner portion is in contact with the dielectric layer.

* * * * *